United States Patent [19]

Kuwabara et al.

[11] Patent Number: 5,259,926

[45] Date of Patent: Nov. 9, 1993

[54] METHOD OF MANUFACTURING A THIN-FILM PATTERN ON A SUBSTRATE

[75] Inventors: Kazuhiro Kuwabara; Yuji Mori; Yoshiro Mikami, all of Hitachi, Japan

[73] Assignee: Hitachi, Ltd., Tokyo, Japan

[21] Appl. No.: 950,286

[22] Filed: Sep. 24, 1992

[30] Foreign Application Priority Data

Sep. 24, 1991 [JP] Japan .................... 3-270458

[51] Int. Cl.⁵ .............................................. B44C 1/22
[52] U.S. Cl. .................... 156/659.1; 156/658; 156/660; 427/264
[58] Field of Search .................. 156/659.1, 658, 660, 156/654; 427/264

[56] References Cited

U.S. PATENT DOCUMENTS

| | | | |
|---|---|---|---|
| 4,294,650 | 10/1981 | Werthmann | 156/660 |
| 4,983,499 | 1/1991 | Suzuki et al. | 156/659.1 |
| 5,008,176 | 4/1991 | Kondo et al. | 156/659.1 |
| 5,091,047 | 2/1992 | Cleeves et al. | 156/659.1 |
| 5,093,158 | 3/1992 | Li et al. | 427/264 |
| 5,123,998 | 6/1992 | Kishimura | 156/659.1 |

Primary Examiner—Brian E. Hearn
Assistant Examiner—Kevin M. Picardat
Attorney, Agent, or Firm—Antonelli, Terry, Stout & Kraus

[57] ABSTRACT

Disclosed is an improvement in a thin-film pattern manufacturing method which includes the steps of providing a thin film on a substrate, forming a mask having a desired pattern on the thin film, and patterning the thin film by removing an exposed portion of the thin film by etching. According to the improvement, the mask is manufactured by forming a layer of an organic resin on the thin film on the substrate and by forming the organic resin layer in the desired pattern by a mechanical forming member. In another embodiment, the organic resin is directly formed or moulded on the thin film by a forming or moulding member.

26 Claims, 5 Drawing Sheets

METHOD OF MANUFACTURING A THIN-FILM PATTERN ON A SUBSTRATE

BACKGROUND OF THE INVENTION

1. Field of the Invention

The present invention relates to a method of manufacturing a thin-film pattern on a substrate and, more particularly, to a method of manufacturing a large-scale mask pattern for use in etching on a large substrate.

2. Description of the Related Art

In a conventional method of manufacturing a thin-film pattern using the etching technique, a protection mask is generally formed by the photolithographic process. Such a conventional protection mask forming technique is disclosed in, for example, "Revised Integrated Circuit Engineering (1)" written by Yuzuru Nagata and Hisayoshi Yanai and published by Corona, from Page 89 to page 91.

FIGS. 6A through 6D schematically illustrate a thin-film pattern manufacturing process by the conventional technique.

In FIGS. 6A through 6D, reference numeral 10 denotes a substrate; 11, a thin film made of a conductor, a semiconductor or an insulating material; 12, a photosensitive organic resin layer; 12a, photosensitized portions; 12b, non-photosensitized portions; 13, a light-transmission type photo mask; 14, photoprotective portions of the photo mask 13; 15, a mask pattern; and 16, a thin-film pattern. The photosensitive organic resin layer 12 and the photo mask 13 are of the negative type.

For patterning the thin film 11, the thin film 11 made of a conductor, a semiconductor or an insulating material is first formed on the substrate 10 by an adequate means, as shown in FIG. 6A, and then a photosensitive organic resin is coated on the thin film 11 to form the photosensitive organic resin layer 12. Next, the photo mask 13 is located above and aligned with the photosensitive organic resin layer 12. After the alignment is completed, ultraviolet radiation (UV) is applied to the photosensitive organic resin layer 12 through the photo mask 13. At that time, since the photoprotective portions 14 of the photo mask 12 prohibit the passage of the ultraviolet (UV) ray, exposure of the photosensitive organic resin layer 12 to the ultraviolet radiation (UV) forms the photosensitized portions 12a and the non-photosensitized portions 12b in the photosensitve organic resin layer 12. Thereafter, the photosensitized portions 12a and the non-photosensitized portions 12b of the photosensitive organic resin layer 12 are subjected to a developing process which employs a developer, as shown in FIG. 6B. Since the solubility of the photosensitized portions 12a to the developer is lower than that of the non-photosensitized portions 12b, only the photosensitized portions 12a remain on the thin film layer 11 after the development process. The remaining photosensitized portions 12a form the mask pattern 15. Subsequently, the thin film 11 is subjected to the wet or dry etching process using the mask pattern 15 as an etching protective mask to remove the portions of the thin film 11 other than the portions thereof which oppose the mask pattern 15, as shown in FIG. 6C. Thereafter, as shown in FIG. 6D, the portions 12a of the mask pattern 15 are removed by a removing solvent or oxygen plasma to form on the substrate 10 the thin-film pattern 16 which is the same as the mask pattern 15.

Since the exposure condition of the photosensitive organic resin layer 12 largely affects the accuracy with which the photo mask 13 is transferred onto the photosensitive organic resin layer 12, when the photosensitive organic resin layer 12 is exposed through the photo mask 13, batch exposure of the resin layer 12 at a uniform illuminance is desired.

However, in the aforementioned conventional technique, there is a limitation to an increase in the size of the exposure device and it is thus difficult to enlarge the area on which batch exposure can be conducted. Hence, when the aforementioned mask pattern 15 is to be transferred onto the substrate 10 of a large area, the substrate 10 is divided into a plurality of areas, and exposure is conducted on each of these areas. That is, the mask pattern 15 is formed for each of the areas, and exposure is conducted on each of the areas. However, when exposure is conducted on each of the plurality of areas, the throughput of the manufacturing process is low and the joining accuracy of the adjacent mask patterns 15 deteriorates at the boundary of the adjacent areas.

SUMMARY OF THE INVENTION

An object of the present invention is to provide a thin-film pattern manufacturing method which is capable of eliminating the drawbacks of the aforementioned conventional technique.

Another object of the present invention is to Provide a thin-film pattern manufacturing method which has a high throughput and eliminates joining of adjoining mask patterns even when a mask is formed on a substrate of a large area.

Still another object of the present invention is to provide an improvement in a thin-film pattern manufacturing method which comprises the steps of forming a thin film on a substrate, forming a mask of a desired pattern on the thin film, and patterning the thin film by removing an exposed portion of the thin film by etching.

In an improved method according to one aspect of the present invention, the step of forming the mask pattern includes the steps of:

forming a layer of an organic resin on the thin film on the substrate; and forming the organic resin layer in a desired pattern by pressing against the organic resin layer a forming surface of a forming member, the forming surface having projections and recesses arranged in substantially the same pattern as the mask pattern.

In an improved method according to another aspect of the present invention, the step of forming the mask pattern includes the steps of:

disposing a cylindrical forming member adjacent the thin film on the substrate, the cylindrical forming member having a peripheral surface which forms a forming surface having projections and recesses arranged in substantially the same pattern as the mask pattern, the cylindrical forming member having substantially the same axial length as a width of the thin film on the substrate;

rotating the thus disposed forming member;

causing a relative movement between the forming member and the substrate on which the thin film is formed; and supplying an organic resin which is not yet set onto a portion of the thin film on the substrate which is located upstream of the forming member and forming the supplied organic resin by the forming surface of said forming member.

In an improved method according to still another aspect of the present invention, the step of forming the mask pattern includes the steps of disposing a cylindrical forming member adjacent the thin film on the substrate, said cylindrical forming member having a peripheral surface which forms a forming surface having projections and recesses arranged in substantially the same pattern as the mask pattern, said cylindrical forming member having substantially the same axial length as a width of the thin film on the substrate;

rotating the thus disposed forming member;

causing a relative movement between the forming member and the substrate on which the thin film is formed;

supplying an organic resin which is not yet set onto the forming surface of said forming member and moulding the supplied organic resin by the forming surface of said forming member; and transferring the thus moulded organic resin onto the thin film on the substrate.

In either of the improved methods according to the present invention, since the mask pattern of an organic resin is manufactured by the forming or moulding member, the developing step required in the above-described type of conventional technique is eliminated. Furthermore, it is possible to form or mould a mask pattern of an organic resin on the substrate of a large area by a single operation.

The above and other objects, features and advantages of the present invention will become more apparent from the following description with reference to the accompanying drawings

DESCRIPTION OF THE PREFERRED EMBODIMENTS

Figure 1A:
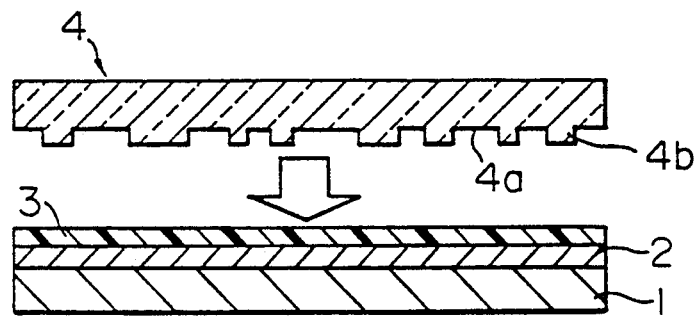
FIGS. 1A through 1D illustrate the four steps of a first embodiment of a mask pattern manufacturing method according to the present invention.

In FIGS. 1A through 1D, reference numeral 1 denotes a substrate; 2, a thin film made of a conductor, a semiconductor or an insulating material; 3, an organic resin layer; 4, a die or a forming member having substantially the same dimensions and shape as those of the substrate 1; 5 a mask pattern; and 6, a thin-film pattern.

The thin film 2 is made of a conductor, such as aluminum (Al) or chromium (Cr), a semiconductor, such as a polycrystalline silicon (p-Si) or amorphous silicon (a-Si) or an insulating material, such as silicon dioxide ($SiO_2$) or silicon nitride ($Si_3N_4$). The thin film 2 is formed on the substrate 1 by a conventional method, such as vacuum deposition, sputtering or CVD. The undersurface of the forming member 4 forms a forming surface having recessed portions 4a and projecting portions 4b arranged in the same pattern as the mask pattern 5.

The manufacturing method of this embodiment is carried out by the following steps.

First, the thin film 2 made of a conductor, a semiconductor or an insulator is formed on the substrate 1 by the aforementioned conventional method, and then a liquid organic resin is uniformly coated on the thus formed thin film 2 to form the organic resin layer 3, as shown in FIG. 1A. Thereafter, the forming member 4 is located above the organic resin layer 3 and is aligned with the substrate 1. After the alignment is completed, the forming member 4 is moved toward the substrate 1 and is uniformly pressed against non-set organic resin layer 3 for forming (embossing) thereof. During pressing, the organic resin layer 3 is displaced by the projecting portions 4b into the spaces formed between the substrate 1 and the recessed portions 4a of the forming member 4. In that case, the substrate 1 and the projecting portions 4b of the forming member 4 are substantially in close contact with each other, and substantially no organic resin is left between the substrate 1 and the projecting portions 4b. The forming member 4 is made of a material which readily peels off from the organic resin and which is adequately strong. A liquid organic resin is used which sets when heated to evaporate the solvent thereof and which exhibits a high resistance to solvents after setting. It is desired that embossing by the forming member 4 be conducted on an organic resin layer 3 having the optimum viscosity. The viscosity of the coated organic resin layer 3 is adjusted by controlling the temperature and by adjusting the forming starting time.

Figure 1B:
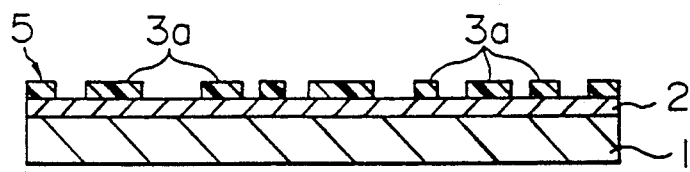

Thereafter, the forming member 4 is separated from the substrate 1, leaving organic resin portions 3a having predetermined dimensions and shapes at predetermined positions on the substrate 1, as shown in FIG. 1B. The substrate 1 with the organic resin portions 3a thereon is sent to, for example, a heating device to heat and set the organic resin portions 3a. After setting, the substrate 1 with the organic resin portions 3a is further heated at the setting temperature for a predetermined period of time to enhance the adhesion between the organic resin portions 3a and the thin film 2 and thereby form the mask pattern 5 serving as the protection mask for etching on the thin film 2.

Figure 1C:
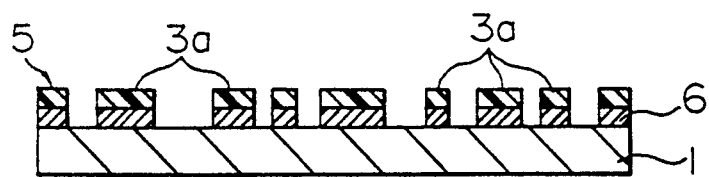
Figure 1D:
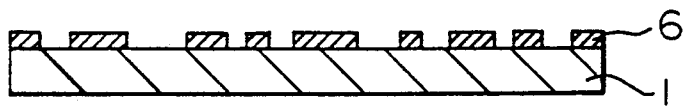

Subsequently, etching of the thin film 2 is conducted using the mask pattern 5 as the protection mask to remove the portions of the thin film 2 other than those covered by the mask pattern 5, as shown in FIG. 1C. Either known wet or dry etching process is selectively used depending on the processing accuracy and the material of the thin film 2 Thereafter, the set organic resin portions 3a, i.e., the mask pattern 5, are removed using a solvent or oxygen plasma to form the thin-film pattern 6 on the substrate 1.

In this embodiment, the forming member 4 is preferred made of a material which passes light therethrough, such as polycarbonate, polymethylmethacrylate or glass, so that the substrate 1 can be seen through the forming member 4 In this way, the alignment between the substrate 1 and the forming member 4 is facilitated.

Furthermore, in this embodiment, the forming member 4 made of a material which passes light therethrough may be used in combination with an organic resin which sets when exposed to light. In this case, after the forming member 4 is pressed against the organic resin layer 3 formed on the substrate 1 to form the organic resin portions 3a having desired dimensions and shapes, an adequate light is illuminated through the forming member 4 on the organic resin portions 3a which have not yet set, to thereby set the resin. In this way, a protective mask (mask pattern 5) having highly accurate dimensions can be obtained In this embodiment, since the organic resin layer 3 on the entire surface of the substrate 1 having a large area can be formed into a desired mask pattern by a single forming operation using the forming member 4, a high throughput can be achieved when the thin-film pattern 6 is formed.

A second embodiment of the present invention will be described below with reference to FIGS. 2A through 2D.

Figure 2A:
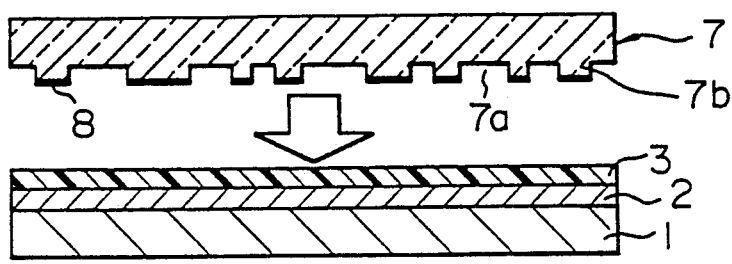
FIGS. 2A through 2D illustrate the four steps of a second embodiment of the mask pattern manufacturing method according to the present invention.

In FIG. 2A, reference numerals 7 and 8 respectively denote a forming member made of a material which passes light therethrough and light-blocking layers. The reference numerals in these figures the same as those in FIGS. 1A through 1D represent similar or identical elements.

As in the case of the forming member 4, the undersurface of the forming member 7 forms a forming portions 7b arranged in the same pattern as a desired mask pattern 5. The light-blocking layers 8, which may be formed of a chromium film, are formed on the projecting portions 7b.

The manufacturing method according to this embodiment will be described below.

First, a thin film 2 made of a conductor, a semiconductor or an insulator is formed on the substrate, and then a liquid photosensitive (photosetting) organic resin is uniformly coated on the formed thin film 2 to form an organic resin layer 3, as shown in FIG. 2A. Thereafter, the forming member 7 is located above the organic resin layer 3 and is aligned with the substrate 1. After the alignment is completed, the forming member 7 is moved toward the substrate 1 and is uniformly pressed against the organic resin layer 3 which is not yet set, for forming the layer 3. Theoretically, the portions of the organic resin layer 3 which face the projecting portions 7b of the forming member 7 are displaced during pressing into the recessed portions 7a. However, in an actual operation, pressing of the forming member 7 may not be enough. In such a case, the organic resin layer 3 is formed such that the portions of the organic resin layer 3 which face the projecting portions 7b of the forming member 7 are thin while the portions thereof which face the recessed portions 7a are thick.

Figure 2B:
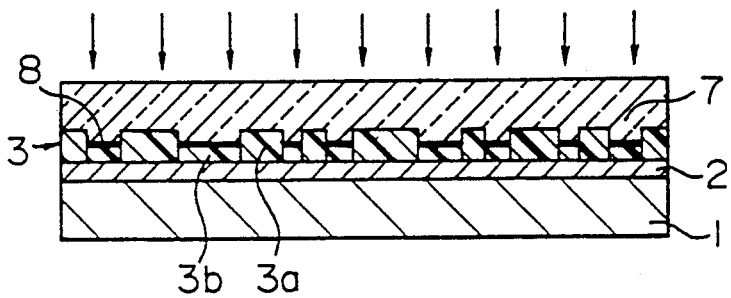
Figure 2C:
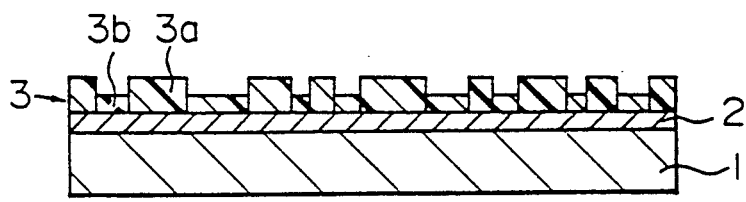
Figure 2D:
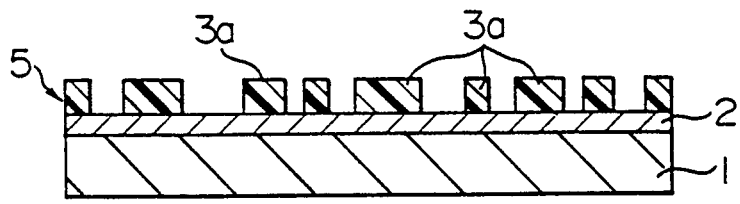

Next, as shown in FIG. 2B, ultraviolet radiation (UV) is illuminated onto the organic resin layer 3 through the forming member 7 which passes the light therethrough. At that time, the photosensitive organic resin which is confined in the recessed portions 7a of the forming member 7 is exposed to the ultraviolet radiation (UV) to thereby form the photosensitized portions 3a. The photosensitive organic resin which remains faced to the projecting portions 7b of the forming member 7 is not exposed to the ultraviolet radiation by the presence of the light-blocking layer 8, Thereafter, as shown in FIG. 2C, the forming member 7 which transmits light therethrough is separated from the substrate 1, leaving the photosensitized portions 3a and the non-photosensitized portions 3b on the thin film 2 on the substrate 1 at predetermined positions. Next, the photosensitive organic resin is subjected to development by a developer. Since the photosensitized portions 3a and the non-photosensitized portions 3b have different solubilities in the developer, the development removes the non-photosensitized portions 3b to form on the thin film 2 a protective mask (mask pattern) 5 which is made of only the photosensitized portions 3a, as shown in FIG. 2D. Thereafter, such a processes as described in connection with FIG. 1D of the first embodiment is conducted to form a thin-film pattern (not shown) on the substrate 1.

This embodiment provides an advantage similar to that of the first embodiment. Furthermore, even when the pressing of the forming member 7 is not enough, a highly accurate mask pattern 5 can be formed.

A third embodiment of the present invention will now be described with reference to FIG. 3.

Figure 3:
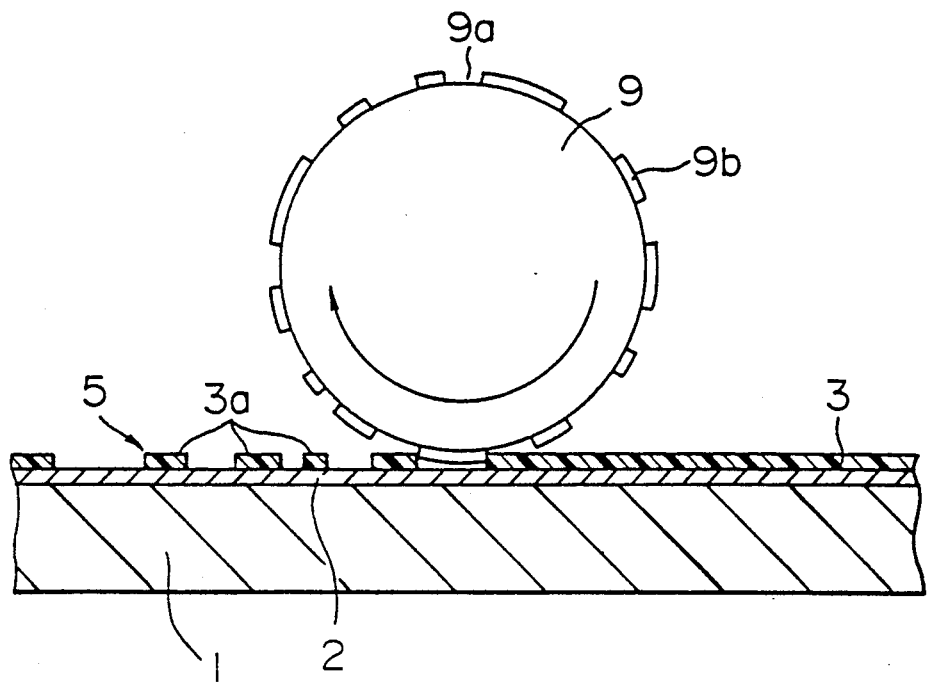
FIG. 3 illustrates one step of a third embodiment of the mask pattern manufacturing method according to the present invention.

In FIG. 3, reference numeral 9 denotes a cylindrical forming member The same reference numerals in FIG. 3 as those shown in FIGS. 1 and 2 represent similar or identical elements The cylindrical forming member 9 has an axial length substantially the same as the width of the effective area of the substrate 1. The outer peripheral surface of the cylindrical forming member 9 forms a forming surface having recessed portions 9a and projecting portions 9b arranged in the same pattern as that of a desired mask pattern 5. The cylindrical forming member 9 does not slide along but is rotated on the substrate 1.

The manufacturing method according to the third embodiment includes the following steps.

As shown in FIG. 3, a thin film 2 made of a conductor, a semiconductor or an insulating material is formed on the substrate 1, and then a liquid organic resin is uniformly coated on the thin film 2 to form a organic resin layer 3. Next, the cylindrical forming member 9 is located above the organic resin layer 3 and is aligned with the substrate 1. After the alignment is completed, the forming member 9 is moved toward the substrate 1 and is then pressed against the organic resin layer 3 which is not yet set. Subsequently, the cylindrical forming member 9 is rotated in a direction indicated by the arrow and is thereby rolled on the substrate 1 without sliding, whereby the portions of the organic resin which face the projecting portions 9b of the forming member 9 are displaced while only the portions of the organic resin which face the recessed portions 9a remain on the thin film 2 on the substrate 1 at predetermined positions to form the protective mask (mask pattern) 5 having desired dimensions and shapes. Thereafter, the etching process and the removal of the protective mask (mask pattern) 5 are conducted, as in the cases of the preceding embodiments, whereby patterning of the thin film 2 on the substrate 1 is completed.

In this embodiment, a desired layer of a layer of the organic resin having thereon repeated patterns, each of which corresponds to the pattern on the forming surface of the cylindrical forming member 9, can be formed on the thin film 2 of the substrate 1 by increasing the number of rotation of the cylindrical forming member 9. Thus, this embodiment is effective to form a plurality of identical thin-film patterns on the overall surface of the substrate 3, as in the case of a TFT liquid crystal panel.

In this embodiment, the cylindrical forming member 9 is rolled on the substrate 1. However, the same results can be obtained by rotating the cylindrical forming member 9 at a fixed portion and by moving the substrate 1 synchronously with the rotation of the forming member 9.

According to the third embodiment, it is possible to successively for a plurality of mask patterns having the same dimensions and shapes on the thin film on the substrate 1 having a large area.

A fourth embodiment of the present invention will be described below with reference to FIG. 4.

Figure 4:
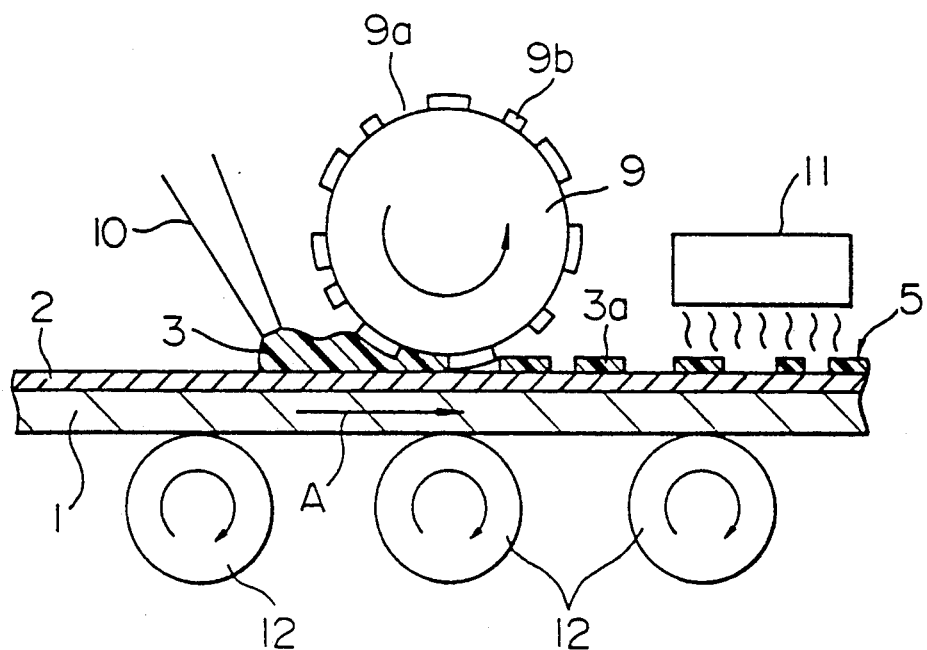
FIG. 4 illustrates one step of a fourth embodiment of the mask pattern manufacturing method according to the present invention.

In FIG. 4, reference numeral 10 denotes an organic resin supply device, 11, a heating device; and 12, rollers. Other reference numerals which are the same as those in the preceding embodiments represent similar or identical elements.

In this embodiment, the cylindrical forming member 9 has substantially the same axial length as the width of the effective area of the substrate 1, as in the case of the third embodiment The outer peripheral surface of the cylindrical forming member 9 forms a forming surface having recessed portions 9a and projecting portions 9b arranged in the same pattern as that of a desired mask pattern 5. The cylindrical forming member 9 and the rollers 12 are rotated synchronously with each other such that the peripheral speed of the cylindrical forming member 9 and the moving speed of the substrate 1 are the same. The organic resin supply device 10 is disposed upstream of the cylindrical forming member 9, as viewed in the direction in which the substrate 1 is moved, to supply the organic resin 3 onto the thin film 2 on the substrate 1, and the heating device 11 is disposed downstream of the cylindrical forming member 9.

The manufacturing method according to the fourth embodiment in carried out by the following steps:

First, the thin film 2 of a conductor, a semiconductor or an insulator is formed on the substrate 1. The substrate 1 with the thin film 2 formed thereon is placed on the rollers 12 and is thereby moved in the direction indicated by an arrow A, while the cylindrical forming member 9 is rotated at a fixed portion. At that time, a required amount of organic resin 3 is supplied by the organic resin supply device 10 into a space between the substrate 1 and the cylindrical forming member 9. The organic resin 3 supplied onto the film 2 on the substrate 1 is conveyed together with the substrate 1 and is formed or moulded by the recessed portions 9a and the projecting portions 9b on the cylindrical forming surface of the cylindrical forming member 9. At that time, the portions of the organic resin which force the projecting portions 9b of the cylindrical forming member 9 are displaced and the portions 3a thereof which face the recessed portions 9a remain on the thin film 2 to form an organic resin member of desired dimension and shape disposed at a predetermined position of the thin film 2 on the substrate 1. Next, the organic resin member on the substrate 1 is heated by the heating device 11 to set it. A protective mask (mask pattern) 5 such as that shown in FIG. 1B of the first embodiment can be obtained on the outlet side of the heating device 11. Thereafter, etching and removal of the protective mask (mask pattern) 5 are conducted, as in the cases of the preceding embodiments, whereby patterning of the thin film 2 on the substrate 1 is completed.

In this embodiment, since the mask pattern 5 is obtained by successively moulding the organic resin portion 3a on the substrate 1, as in the case of the third embodiment, patterning of the thin film 2 formed on the substrate 1 having a large area can be conducted at a high throughput and with a high degree of accuracy.

The heating device 11 may be employed in the embodiment shown in FIG. 3 to set the formed organic resin portions 3a.

A fifth embodiment of the present invention will be described below with reference to FIG. 5.

Figure 5:
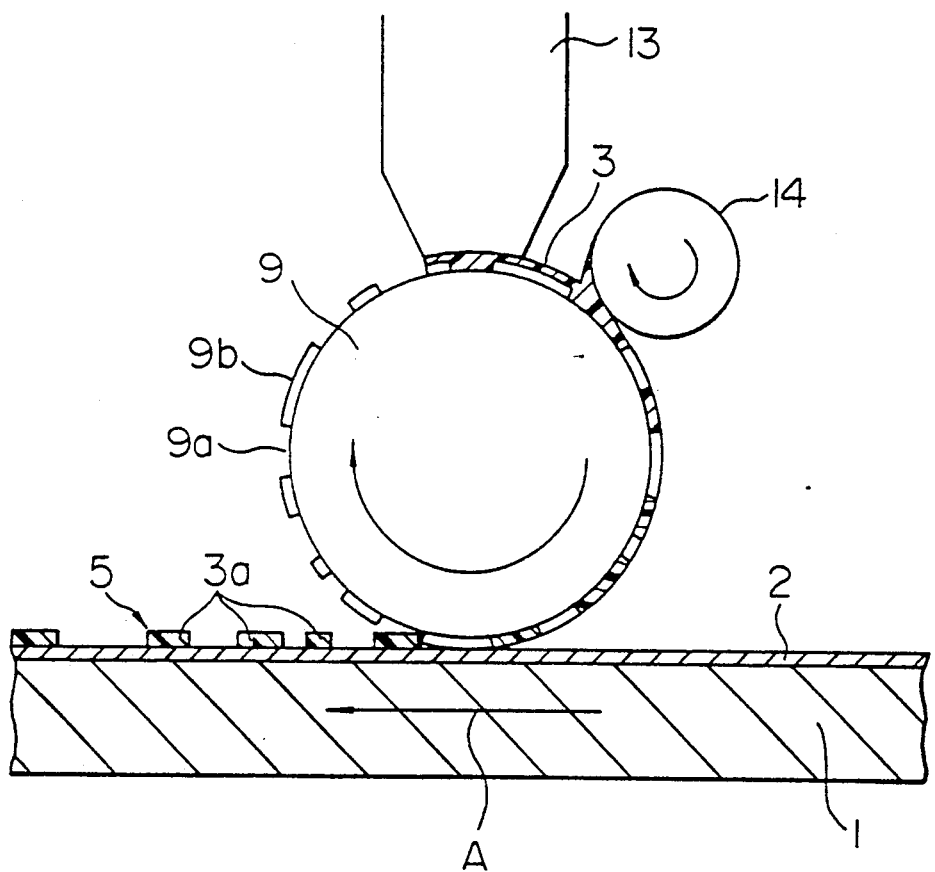
FIG. 5 illustrates one step of a fifth embodiment of the mask pattern manufacturing method according to the present invention.
Figure 6A:
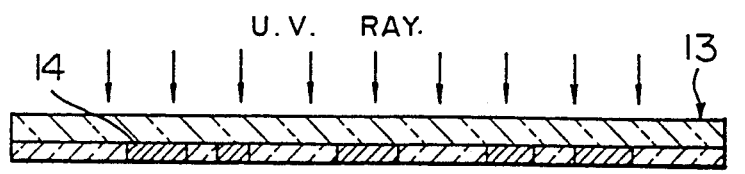
FIGS. 6A to 6D illustrate the manufacturing process of a conventional mask pattern manufacturing method.
Figure 6B:
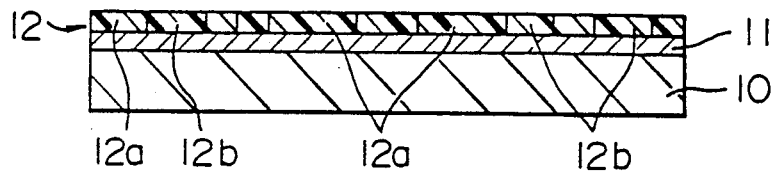
Figure 6C:
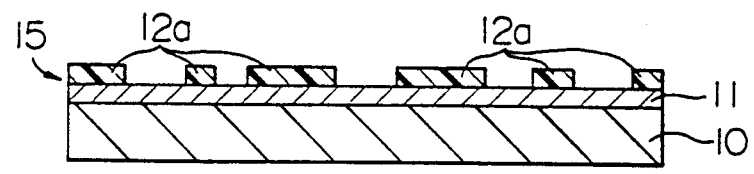
Figure 6D:
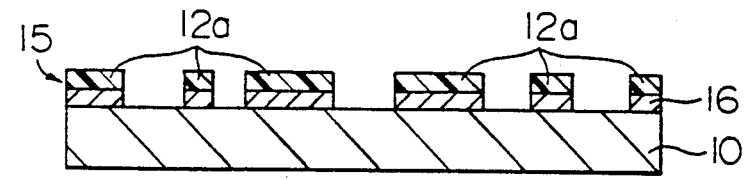

In FIG. 5, reference numerals 13 and 14 respectively denote an organic resin supply device and a wiping roller. The same reference numerals in FIG. 5 as those in the preceding embodiments represent similar or identical elements.

In this embodiment, a cylindrical forming member 9 has substantially the same axial length as the width of the effective area of the substrate 1. The Peripheral surface of the cylindrical forming member 9 forms a forming surface having recessed portions 9a and projecting portions 9b arranged in the same pattern as that of a desired mask pattern 5. The cylindrical forming member 9 is rotated at a fixed position. The peripheral speed of the cylindrical forming member 9 and the moving speed of the substrate 1 are the same. The organic resin supply device 13 supplies the organic resin 3 onto the forming surface of the cylindrical forming member 9 from above the cylindrical forming member 9. The wiping roller 14 has substantially the same axial length as that of the cylindrical forming member 9. The wiping roller 14 is rotated in a direction opposite to that of the movement of the forming surface and is disposed such that the roller 14 is in contact with the forming surface of the cylindrical forming member 9 to wipe the excess organic resin 3 from the forming surface of the cylindrical forming member 9

The manufacturing method according to the fifth embodiment is carried out by the steps described below.

As shown in FIG. 5, a thin film 2 made of a conductor, a semiconductor or an insulator is formed on the substrate 1. The substrate 1 with the thin film 2 formed thereon is moved in a direction indicated by an arrow A, while the cylindrical forming member 9 is rotated at a fixed position At that time, the organic resin 3 is supplied from the organic resin supply device 13 onto the upper side of the cylindrical forming member 9, so that the organic resin 3 is attached to the surface of the cylindrical forming member 9. Thereafter, excess organic resin is wiped off by the wiping roller 14 so that the organic resin 3 is deposited only in the recessed portions 9a of the cylindrical forming member 9. As the cylindrical forming member 9 is further rotated, the forming surface with the organic resin 3 thereon is moved toward and brought into contact with the thin film 2 on the substrate 1, whereby organic resin portions 3a deposited in the recessed portions 9a of the cylindrical forming member 9 are transferred onto the thin film 2 on the substrate 1. Thereafter, the organic resin portions 3a formed on the substrate 1 are set by an adequate method (for example, by using the heating device 11 shown in FIG. 3) to form a protective mask (mask pattern) 5 such as that shown in FIG. 1B of the first embodiment. Thereafter, etching and removal of the protective mask (mask pattern) 5 are performed, as in the cases of the preceding embodiments, whereby patterning of the thin film 2 on the substrate 1 is completed.

In this embodiment, the protecting mask 5 for use in etching the thin film 2 on the substrate 1 can be continuously formed at a high degree of accuracy, as in the cases of the third and fourth embodiments. Consequently, the thin film formed on the substrate 1 having a large area can be patterned at a high throughput and with a high degree of accuracy.

As will be understood from the foregoing description, according to the present invention, since forming or moulding is conducted directly on the organic resin layer by using a forming or moulding member, the developing process required in the prior art can be eliminated, so that the throughput for the thin-film pattern manufacturing can be improved. Furthermore, since a mask pattern made of an organic resin layer can be formed or moulded over the entire surface area of the substrate by a single operation, joining of a plurality of mask patterns is unnecessary even when a substrate having a large area is to be masked, whereby a thin-film pattern can thus be formed on the entire surface of the substrate with a high degree of accuracy.

What is claimed is:

1. A method of manufacturing a thin-film pattern, said method including the steps of providing a thin film on a substrate, forming a mask having a desired pattern on the thin film, and patterning the thin film by removing an exposed portion of the thin film by etching,
   wherein said step of forming the mask pattern includes the steps of:
   forming a layer of an organic resin on the thin film on the substrate; and
   forming the organic resin layer in the desired pattern by pressing against the organic resin layer a forming surface of a forming member, the forming surface having projections and recesses arranged in substantially the same pattern as the mask pattern.

2. A method of manufacturing a thin-film pattern according to claim 1, wherein the forming member is made of a material which passes light therethrough.

3. A method of manufacturing a thin-film pattern according to claim 1, wherein the forming member is made of a material which passes light therethrough, wherein the organic resin is a resin which sets when exposed to light, and wherein after the organic resin layer is formed by the pressing of the forming member, light is illuminated onto the organic resin formed in the desired pattern through the forming member to set the organic resin and thereby make the mask pattern.

4. A method of manufacturing a thin-film pattern according to claim 1, wherein the forming member is made of a material which passes light therethrough, wherein the organic resin is a resin which sets when exposed to light, wherein light-blocking layers are provided on the projections of the forming member, and wherein after the organic resin layer is formed by the pressing of the forming member, light is illuminated onto the organic resin formed in the desired pattern through the forming member to set portions of the organic resin which face the recesses of the forming member and thereby make the mask pattern.

5. A method of manufacturing a thin-film pattern according to claim 1, wherein the forming member has a flat plate-like form, and wherein the forming surface of the forming member has substantially the same dimension and shape as those of the thin film on the substrate.

6. A method of manufacturing a thin-film pattern according to claim 1, wherein the forming member comprises a rotatable cylindrical member having substantially the same axial length as a width of the thin film on the substrate, and wherein a relative movement is caused between the cylindrical forming member and the substrate while the forming member is rotating so as to form the organic resin layer in the desired pattern.

7. A method of manufacturing a thin-film pattern according to claim 6, wherein the organic resin formed in the desired pattern is heated and thereby set to form the mask pattern of the organic resin on the thin film on the substrate.

8. A method of manufacturing a thin-film pattern according to claim 1, wherein said thin film is made of a conductive material.

9. A method of manufacturing a thin-film pattern according to claim 1, wherein said thin film is made of an insulating material.

10. A method of manufacturing a thin-film pattern according to claim 1, wherein said thin film is made of a semiconductor material.

11. A method of manufacturing a thin-film pattern according to claim 1, wherein said organic resin is a resin that sets upon heating, and wherein the method includes the further step of heating the organic resin layer after forming the organic resin layer in the desired pattern, so as to set the organic resin layer formed in the desired pattern.

12. A method of manufacturing a thin-film pattern, said method including the steps of providing a thin film on a substrate, forming a mask having a desired pattern on the thin film, and patterning the thin film by removing an exposed portion of the thin film by etching,
    wherein said step of forming the mask pattern includes the steps of:
    disposing a cylindrical forming member adjacent the thin film on the substrate, said cylindrical forming member having a peripheral surface which forms a forming surface having projections and recesses arranged in substantially the same pattern as the mask pattern, said cylindrical forming member having substantially the same axial length as a width of the thin film on the substrate;
    rotating the thus disposed forming member;
    causing a relative movement between the forming member and the substrate on which the thin film is formed; and
    supplying an organic resin which is not yet set onto a portion of the thin film on the substrate which is located upstream of the forming member and forming the supplied organic resin by the forming surface of said forming member.

13. A method of manufacturing a thin-film pattern according to claim 12, wherein the formed organic resin is heated and thereby set to form the mask pattern of the organic resin on the thin film on the substrate.

14. A method of manufacturing a thin-film pattern according to claim 13, wherein said forming member is rotated at a fixed position, wherein the substrate with the thin film formed thereon is moved relative to the rotating forming member, and wherein the heating is performed by a heating device disposed downstream of the forming member as viewed in the direction of movement of the substrate.

15. A method of manufacturing a thin-film pattern according to claim 12, wherein the cylindrical forming member rotates but does not slide relative to the substrate on which the thin film is formed.

16. A method of manufacturing a thin-film pattern according to claim 12, wherein the cylindrical forming member is rolled on the substrate.

17. A method of manufacturing a thin-film pattern according to claim 12, wherein the cylindrical forming member rotates at a fixed position, and the substrate is moved.

18. A method of manufacturing a thin-film pattern, said method including the steps of providing a thin film on a substrate, forming a mask having a desired pattern on the thin film, and patterning the thin film by removing an exposed portion of the thin film by etching, wherein said step of forming the mask pattern includes the steps of:

disposing a cylindrical forming member adjacent the thin film on the substrate, said cylindrical forming member having a peripheral surface which forms a forming surface having projections and recesses arranged in substantially the same pattern as the mask pattern, said cylindrical forming member having substantially the same axial length as a width of the thin film on the substrate;

rotating the thus disposed forming member;

causing a relative movement between the forming member and the substrate on which the thin film is formed;

supplying an organic resin which is not yet set onto the forming surface of said forming member and moulding the supplied organic resin by the forming surface of said forming member; and transferring the thus moulded organic resin onto the thin film on the substrate.

19. A method of manufacturing a thin-film pattern according to claim 18, wherein the organic resin transferred onto the substrate is heated and thereby set to form the mask pattern of the organic resin on the thin film.

20. A method of manufacturing a thin-film pattern according to claim 19, wherein the forming member is rotated at a fixed position, wherein the substrate with the thin film formed thereon is moved relative to the rotating forming member, and wherein the heating is performed by a heating device disposed downstream of the forming member as viewed in the direction of movement of the substrate.

21. A method of manufacturing a thin-film pattern according to claim 18, wherein the step of moulding the supplied organic resin by the forming surface of the forming member includes wiping the forming surface of the forming member with a wiping member, after supplying the organic resin and prior to transferring the moulded organic resin.

22. A method of forming a mask pattern, comprising the steps of:

forming a layer of an organic resin on a substrate; and forming the organic resin layer into the mask pattern on the substrate by pressing against the organic resin layer a forming surface of a forming member, the forming surface having projections and recesses arranged in substantially the same pattern as the mask pattern.

23. A method of forming a mask pattern according to claim 22, wherein said forming member is a cylindrical forming member that rotates relative to the substrate so as to form the organic resin layer into the mask pattern.

24. A method of forming a mask pattern according to claim 22, wherein said forming member is made of a material that passes light therethrough, and wherein the organic resin layer is made of a resin that sets upon exposure to the light.

25. A method of forming a mask pattern according to claim 24, wherein a layer of light-blocking material is provided on the projections of the forming member.

26. A method of manufacturing a mask pattern, comprising the steps of:

disposing a forming member adjacent a substate, said forming member having a forming surface with projections and recesses arranged in substantially a same pattern as the mask pattern;

supplying an organic resin which is not yet set onto the forming surface of said forming member and moulding the supplied organic resin by the forming surface of the forming member; and transferring the thus moulded organic resin onto the substrate.

* * * * *